United States Patent
Kiefer

(10) Patent No.: US 6,420,870 B1
(45) Date of Patent: Jul. 16, 2002

(54) METHOD FOR ACQUIRING RAW DATA FOR MAGNETIC RESONANCE IMAGING, AND TOMOGRAPHY APPARATUS OPERATING ACCORDING TO THE METHOD

(75) Inventor: Berthold Kiefer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/324,447

(22) Filed: Jun. 2, 1999

(30) Foreign Application Priority Data

Jun. 3, 1998 (DE) .......................................... 198 24 762

(51) Int. Cl.[7] ................................................ G01V 3/00
(52) U.S. Cl. ....................................... 324/307; 324/309
(58) Field of Search ................................ 324/312, 309, 324/307, 318

(56) References Cited

U.S. PATENT DOCUMENTS

| 5,270,654 A | | 12/1993 | Feinberg et al. | |
| 5,402,067 A | * | 3/1995 | Pauly et al. | 324/307 |
| 5,545,990 A | | 8/1996 | Kiefer et al. | |
| 5,814,991 A | * | 9/1998 | Deimling | 324/309 |
| 5,825,185 A | * | 10/1998 | Liu et al. | 324/309 |
| 6,252,400 B1 | * | 6/2001 | Loncar et al. | 324/309 |

FOREIGN PATENT DOCUMENTS

| EP | 0 572 075 | 12/1993 |
| EP | 0 678 754 | 10/1995 |

OTHER PUBLICATIONS

"Halving MR Imagaing Time by Conjugation: Demonstration at 3.5kG," Feinberg et al., Radiology, Vo. 161 (1986) pp. 527–531.

"Bildgebende Sequenzen in der Kernspintomographie und ihre klinische Anwendung," Nitz, electromedica vol. 64, No. 1 (1996), pp. 23–29.

* cited by examiner

Primary Examiner—Edward Lefkowitz
Assistant Examiner—Tiffany A. Fetzner
(74) Attorney, Agent, or Firm—Schiff Hardin & Waite

(57) ABSTRACT

In a turbo-spin echo sequence for acquiring raw data and nuclear magnetic resonance tomography apparatus, the phase-encoding of the nuclear magnetic resonance signals is implemented with so that the echos occurring after a each excitation are allocated to segments of successive rows of a raw data matrix.

8 Claims, 5 Drawing Sheets

US 6,420,870 B1

METHOD FOR ACQUIRING RAW DATA FOR MAGNETIC RESONANCE IMAGING, AND TOMOGRAPHY APPARATUS OPERATING ACCORDING TO THE METHOD

BACKGROUND OF THE INVENTION

1. Field of the Invention

The present invention is directed to a method, in the form of a pulse sequence, for acquiring raw data for use in magnetic resonance imaging. The present invention is also directed to a magnetic resonance tomography apparatus operating according to the inventive method.

2. Description of the Prior Art

An especially fast method for acquiring image information in magnetic resonance apparatus is known as the turbo-spin echo method and is disclosed, for example, in U.S. Pat. No. 5,545,990. In this method, nuclear spins are excited with a 90° radio-frequency excitation pulse and are subsequently refocused by a number of 180° radio-frequency refocusing pulses. This is repeated at successive times defined by the repetition time until all data for a complete magnetic resonance image have been acquired. This method is significantly faster than conventional spin echo sequences wherein only one refocusing ensues after every excitation, i.e. only one nuclear magnetic resonance signal is acquired. The turbo-spin echo method, however, is usually employed for T1 and proton density contrast and exhibits a non-negligible loss of resolution compared to the spin echo method.

SUMMARY OF THE INVENTION

It is an object of the present invention to provide a method, in the form of a pulse sequence, for acquiring raw data for magnetic resonance imaging wherein the above-described loss of resolution in a turbo-spin echo sequence is avoided.

It is a further object of the present invention to provide a magnetic resonance imaging apparatus, operable using a pulse sequence based on the known turbo-spin echo sequence, wherein the above-discussed loss of resolution associated with the traditional turbo-spin echo sequence is avoided.

The above objects are achieved in accordance with the invention in a method and apparatus wherein an examination subject is irradiated with a number of RF excitation pulses with a repetition time between the pulses and with an RF refocusing pulse emitted after each RF excitation pulse, with at least one magnetic resonance echo signal being acquired after every RF refocusing pulse, with each magnetic resonance echo signal being phase-encoded in at least one direction by a predetermined phase-encoding gradient, and wherein the nuclear magnetic resonance signals are sampled, digitized and phase-sensitively demodulated and are entered into rows of a raw data matrix in an order corresponding to their phase-encoding, and wherein the phase-encoding of the magnetic resonance echo signals is implemented in a time sequence so that the echos which occur after each excitation are allocated to segments of interconnected (successive) rows of the raw data matrix.

Differing from the traditional turbo-spin echo method, the acquired nuclear magnetic resonance signals in the inventive method and apparatus are not entered into segments of the raw data matrix according to the echo number within the individual excitations, but instead are grouped according to the excitations. The edge rows of the raw data matrix thus exhibit an amplitude that is comparable to the central rows of the raw data matrix. Since the edge rows determine the resolution of the image, the resolution is correspondingly improved.

The number of radio-frequency refocusing pulses emitted after each radio-frequency excitation pulse can be increased for radio-frequency excitation pulses which occur later in the overall data acquisition scan. Since the central rows of the raw data matrix determine the contrast, echo trains that are arbitrarily long cannot be employed for these central rows without falsifying the T1 or proton density contrast. The later nuclear magnetic resonance signals allocated to the edge rows of the raw data matrix, however, have a determining effect which is critical only for the resolution, so that longer echo trains, i.e. a greater number of radio-frequency refocusing pulses, can be employed for registering these.

Amplitude discontinuities in the raw data matric can be avoided by an averaging of measured values in an embodiment of the invention.

DESCRIPTION OF THE PREFERRED EMBODIMENTS

Figure 1:
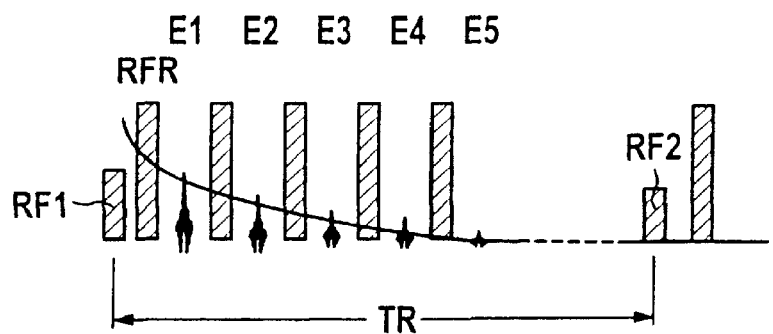
FIG. 1 shows an example of a pulse train according to the standard turbo-spin echo method.
Figure 2:
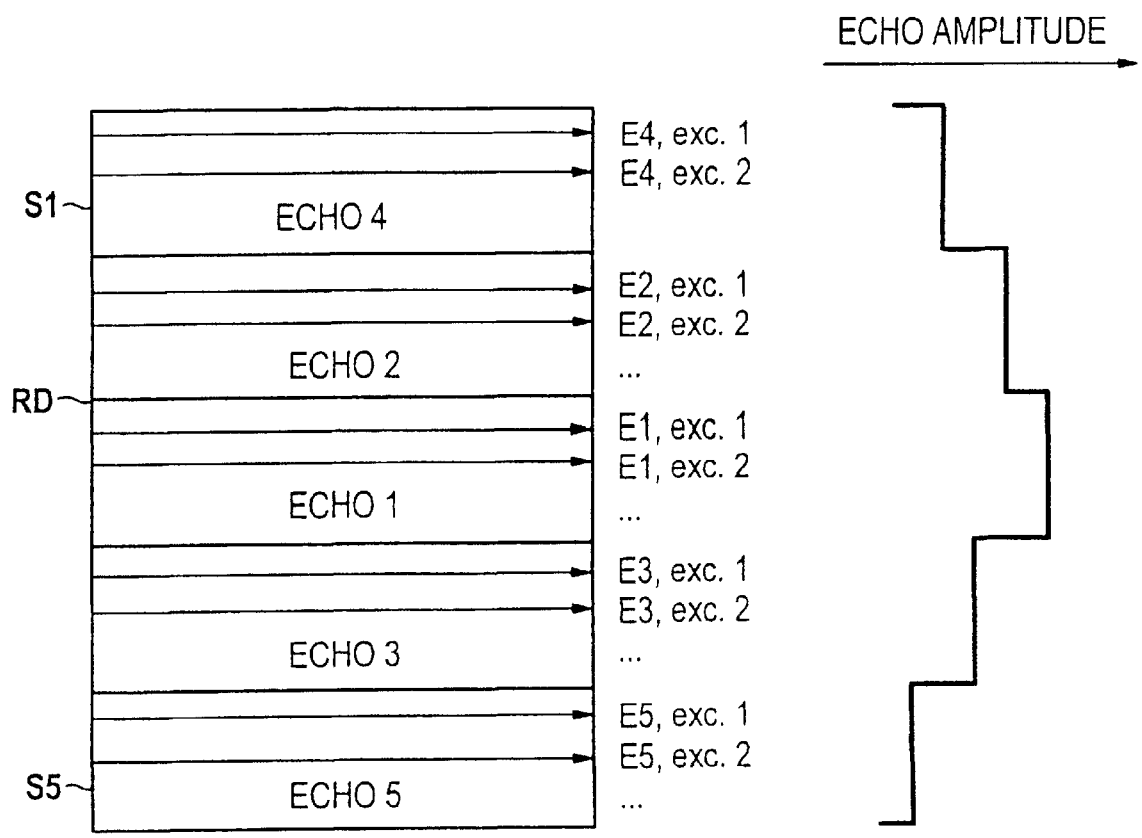
FIG. 2 shows the classification of the spin echos and their amplitude according to the traditional spin echo method.
Figure 3:
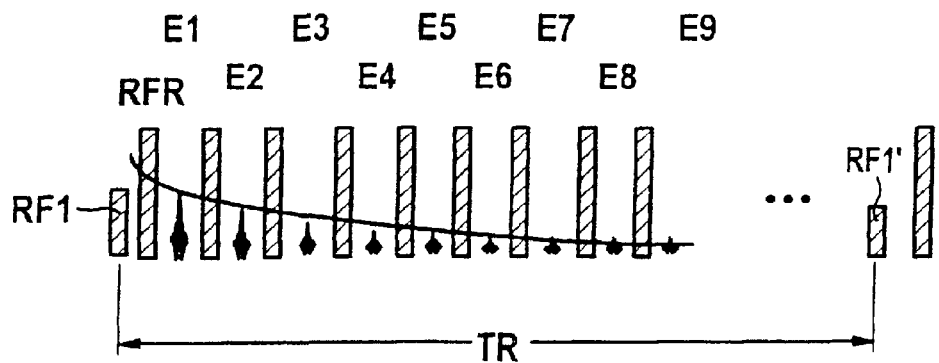
FIG. 3 shows a pulse train as exemplary embodiment of the invention.

For explaining the problem, FIGS. 1 and 2 show the classification of the nuclear magnetic resonance signals in the traditional turbo-spin echo method. A 90° RF excitation pulse RF1 is followed by five 180° RF refocusing pulses RFR in the exemplary embodiment. A nuclear magnetic resonance signal in the form of an echo E1 through E5 is measured after each of these RF refocusing pulses RFR. A further pulse train of excitation and refocusing follows at the spacing of the repetition time TR between the excitation pulse RF1 and a next excitation pulse RF2.

For each echo E, m measured values are acquired by phase-sensitive demodulation, sampling and digitization, these values being entered in a row of a raw data matrix RD per echo E. As is known, the allocation of the respective echo to the k-space row is determined by phase-encoding of the individual echos. In the traditional turbo-spin echo method, the raw data matrix is divided into a number of segments S1 ... S5 that corresponds to the number of echos E after each excitation. Each segment S1 ... S5 includes a number of rows that corresponds to the number of excitations for producing a complete image data set. The classification of the measured values for the individual echos then ensues such that all first echos E1 of all excitations are entered to the central segment. This is based on the fact that the central rows of the raw data matrix critically determine the image contrast and the signal-to-noise ratio. In view of the signal-to-noise ratio, it is conventional to strive to employ the signal having the highest amplitude for the central k-space rows. As can be seen in FIG. 1, however, the signal amplitudes decrease with the T2 relaxation time with increasing distance from the excitation. It can also be seen that the first echo E1 exhibits the greatest proton density or T1 weighting, and thus determines the proton density or T1 contrast of the image as desired. Later echos, by contrast, exhibit a T2 weighting. Since these echos, however, have less influence on the image contrast in the edge rows, the desired T1 or proton density contrast is hardly disturbed.

In summary, the central rows of the raw data matrix are occupied with the echo signals in the traditional method that exhibit both the highest amplitude as well as the highest T1 or proton density weighting, so that an optimum signal-to-noise ratio and a T1 or proton density weighting is obtained. Toward the edge, the echos are classified with significantly lower amplitude and T2 weighting, but these echos do not have a critical influence on the signal-to-noise ratio nor on the image contrast, but only influence the image resolution.

Given turbo-spin echo sequences with T1 or proton density weighting, three through five echos are conventionally refocused per excitation. A relatively low read-out bandwidth is thereby employed, so that the echo-to-echo spacing lies at approximately 10 ms through 20 ms.

The T2 weighting of the edge rows of the raw data matrix occurring in the traditional turbo-spin echo methods, which, of course, determines the resolution of the image, causes a noticeable loss of resolution compared to traditional spin echo sequences. This loss of resolution becomes more acute as the number of refocused echos per excitation increases, since the time spacing from the excitation, and thus the signal amplitude of the last echos, thus decreases. The resolution loss also increases with decreasing relaxation time T2.

An exemplary embodiment of the invention is presented below with reference to FIGS. 3 through 6. Based on FIG. 1, FIG. 3 first shows the echo pulse train, wherein nine echos E1 through E9 are refocused in this example after the first excitation with the excitation RF pulse RF1 and before a next excitation pulse RF1. The time interval between excitation and the last echo E9 determines the amplitude of the last echo E9 due to the T2 drop. In order not to allow this time interval to become too great, a relatively high readout bandwidth is employed, so that the echo-echo spacing lies at approximately 4 through 5 ms. The readout duration has an inverse relationship to the readout bandwidth, as is known.

As in the prior art, the rows of the raw data matrix shown in FIG. 4 are again divided into segments. In the inventive method, however, a segment no longer has a specific echo number but a specific excitation allocated to it. The nine echos E1 through E9 of the first excitation ecx1 are entered into the central segment S0; the echos of the second excitation exc2 are entered into the segment S1 following in positive direction; all echos of the third excitation exc3 are entered into the segment S-1 following in negative direction, etc. Due to this type of classification, the echo amplitude A and the T2 weighting in the edge segments S2 and S-2 roughly corresponds to the echo amplitude A and the T2 weighting in the central segment S0, So so that the above-described loss of resolution due to the T2 drop does not occur.

The number of echos per excitation can be increased for the edge segments. For example, 33 echos can be acquired in each of the excitations 2 through 5. Although the signal drop due to the T2 drop from the first to the last echo after the excitation thus becomes more serious, this has less negative influence in the edge segments.

Figure 4:
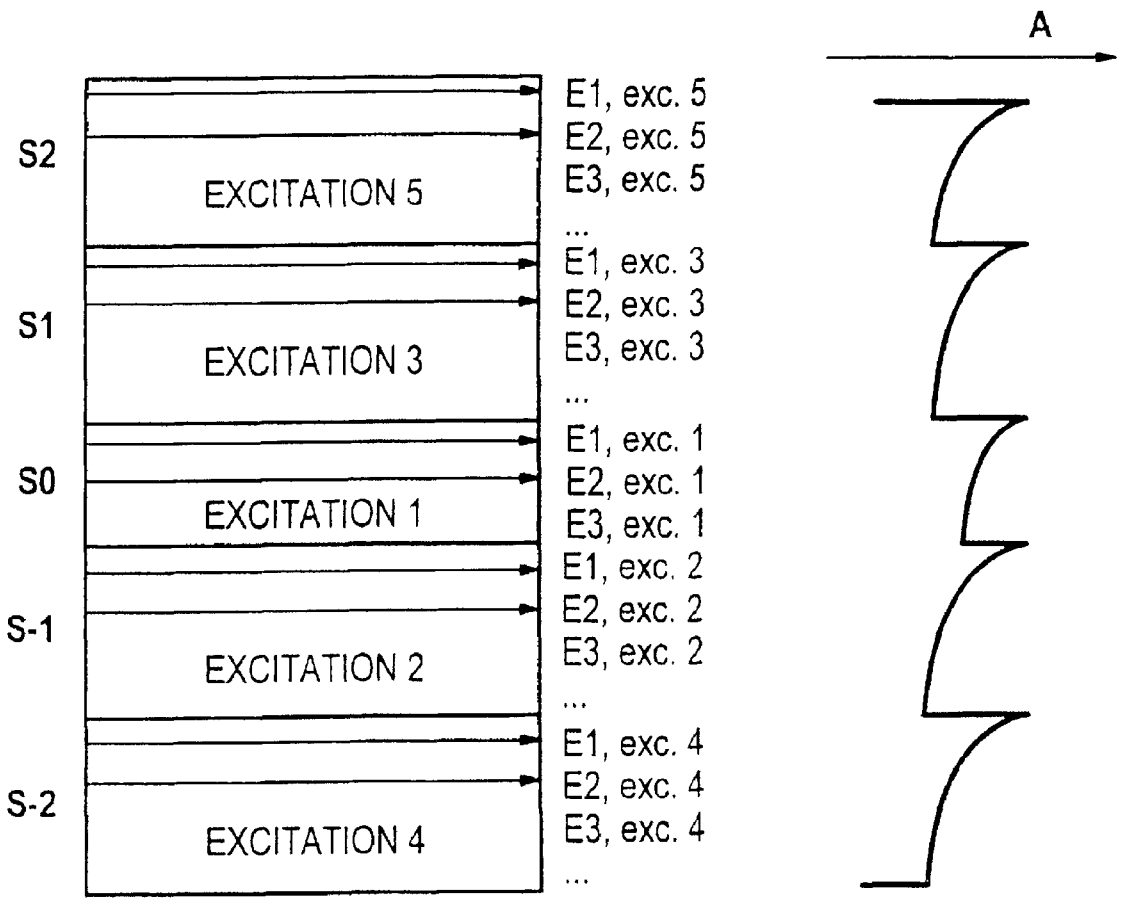
FIG. 4 shows an exemplary embodiment for the classification of the spin echos in raw data matrices as well as the corresponding amplitude curve as exemplary in accordance with the invention.
Figure 5:
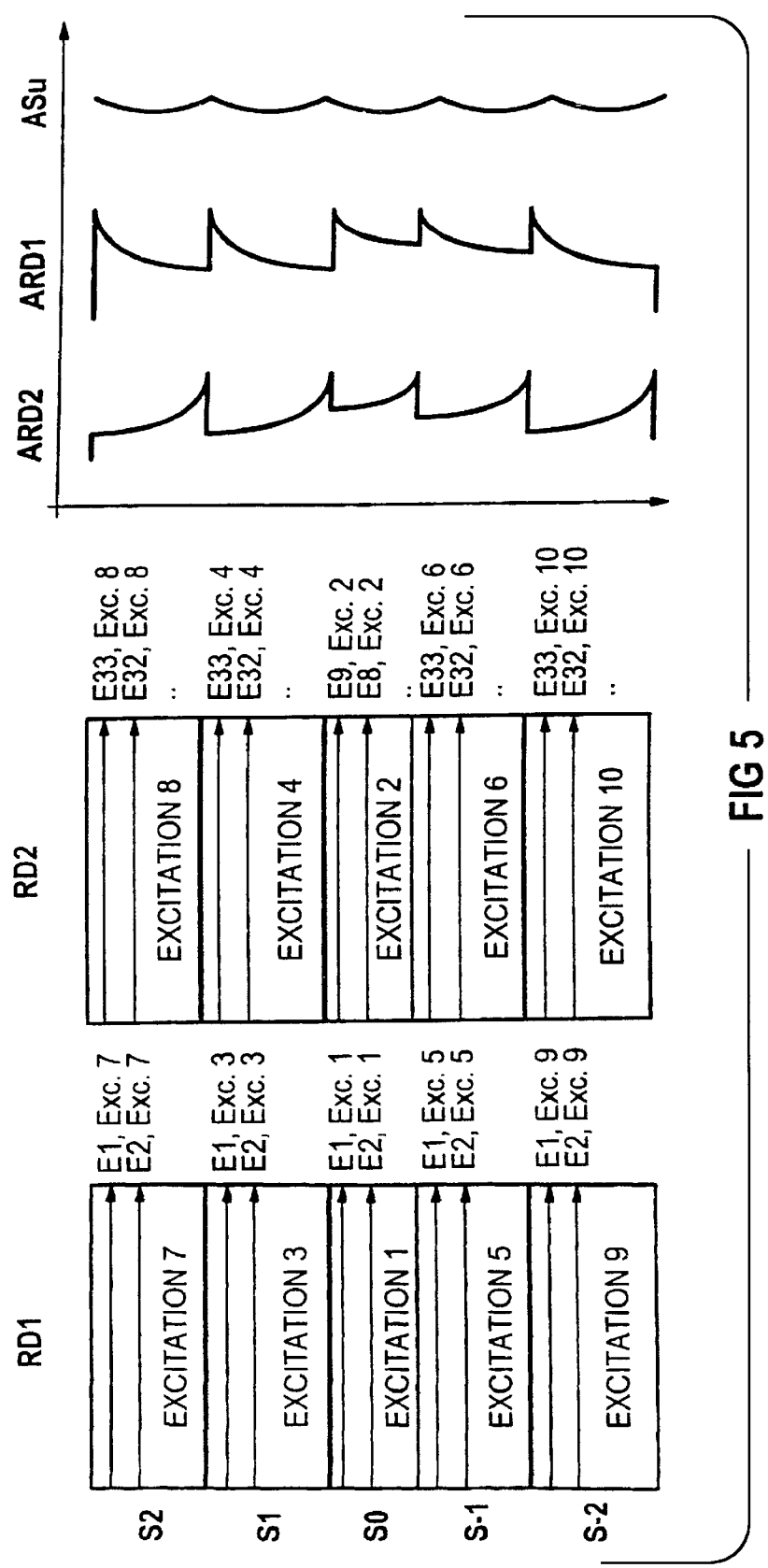
FIG. 5 shows an exemplary embodiment for the averaging of the nuclear magnetic resonance signals in accordance with the invention.

In the exemplary embodiment according to FIG. 4, relatively pronounced amplitude discontinuities occur between the individual segments and these may degrade the image quality. In order to avoid this, and based on the method disclosed in U.S. Pat. No. 5,545,990, an averaging of differently acquired raw data sets can be implemented. This is shown as an example in FIG. 5. For this purpose, two complete data sets are acquired, i.e. two complete raw data matrices RD1 and RD2 are occupied, with the number of excitations in the example being doubled from five to ten. The two data sets RD1 and RD2 are identically segmented. The echos of the first excitation are entered into the central segment of the first data set RD1; the echos of the second excitation Exc2 are entered into the central segment of the second raw data matrix RD2; the echos of the third excitation are entered into the segment S1 of the first raw data matrix; the echos of the fourth excitation Exc4 are entered into the segment S1 of the second raw data set RD2, etc. In this case, of course, the number of echos per excitation in the appertaining excitations in the first and second raw data set RD1 and RD2 must coincide. The phase-encoding is thereby controlled such that the sequence of the occupied k-rows in the two raw data sets proceeds oppositely; in other words, the first echo E1 of each excitation has the highest row number of the appertaining segment allocated to it in the raw data set RD1 and the last echo of each excitation has the lowest row number of the corresponding segment allocated to it. In the data set RD2, by contrast, the first echo of each excitation is allocated to the lowest row number in the appertaining segment and the last echo is allocated to the highest row number. An opposite amplitude curve over the rows of the raw data sets RD1 and RD2 thus arises for each segment (referenced ARD1 and ARD2, respectively in FIG. 5). When the two data sets are then added (or, expressed in other terms, averaged), then a nearly balanced amplitude curve as shown with the designation ASu in the right part of FIG. 5 is obtained.

The classification of the individual measured signals into rows of the raw data matrices is defined, as is known, by phase-encoding of the nuclear magnetic resonance signals. The raw data matrices can be considered as measured data space that is generally referred to as k-space. The following definitions are valid for the k-space:

$$k_x(t) = \gamma \int_0^t G_x(t')dt'$$

$$k_y(t) = \gamma \int_0^t G_y(t')dt'$$

$$k_z(t) = \gamma \int_0^t G_z(t')dt'$$

wherein y is the Larmor constant and $G_X$, $G_Y$, $G_Z$ are magnetic field gradients in the respective x, y and z directions of a Cartesian coordinate system.

An image can then be reconstructed from a raw data set in the k-space, i.e. the raw data matrix RD according to FIG. 4, since the relationship between the spatial domain (i.e., the image) and the k-space exists mathematically via the following, multi-dimensional Fourier transformation:

$$S(k_x,k_y,k_z)=\int\int\int \rho(x,y,z)e^{i(k_x x, k_y y, k_z z)}dxdydz$$

wherein ρ (x, y, z) is the spin density distribution. Since the measured values are present as discrete, numerical values, the Fourier transformation is implemented as discrete Fourier transformation with FFT (Fast Fourier Transform) methods.

As already mentioned, each signal E occupies a row of the raw data matrix. The row position, corresponding to the above comments, is thereby determined by the value $k_y$, i.e. by the time integral over the preceding phase-encoding gradient in y-direction.

Figure 6:
FIG. 6 shows an exemplary embodiment for the phase-encoding of the nuclear magnetic resonance signals in accordance with the invention.

FIG. 6 shows an example of the phase-encoding of the nuclear magnetic resonance signals for seven echos of the segment S0 of the raw data matrix RD presented above. A 90° RF excitation pulse with following 180° RF refocusing pulses are shown in the first line. An echo E follows after every RF refocusing pulse RFR, this echo E being frequency-coded by the influence of a readout gradient GR according to line 2. A phase dispersion in the row direction of the raw data matrix RD arises due to this frequency coding. The phase-encoding gradient GP is shown in the third line. The first echo E1 is phase-encoded most strongly in the positive direction, so that it occupies the uppermost row corresponding to the small k-space position in the central segment S0. Subsequently, the phase-encoding is in turn reset for this echo E1, as is standard in turbo-spin echo sequences. The following echos are phase-encoded with lower amplitude until the echo E4, that exhibits no phase-encoding and thus occupies the zero row of the raw data row RD. Subsequently, the echos are increasingly negatively phase-encoded.

Figure 7:
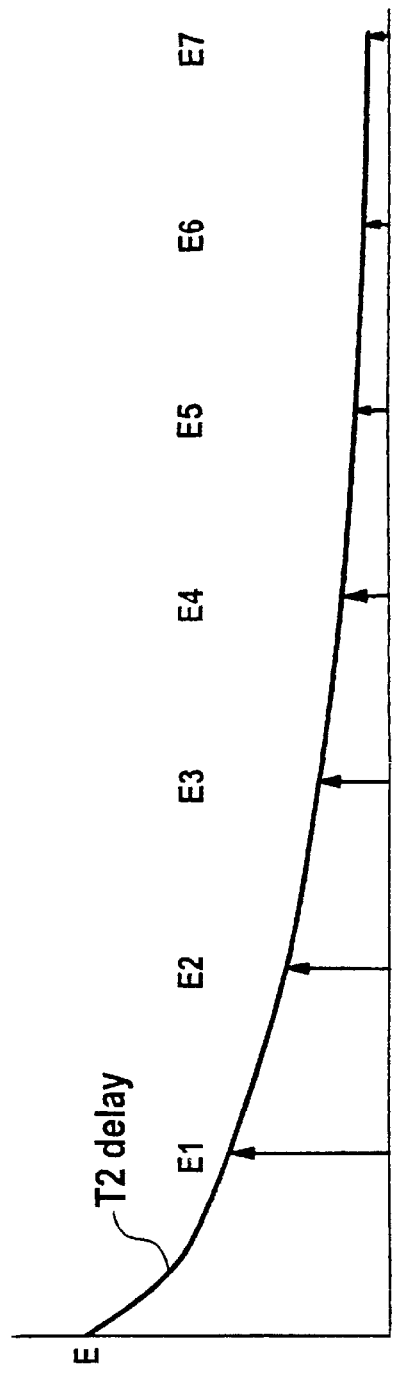
FIG. 7 shows the T2 drop of the nuclear magnetic resonance signals over an echo train.

FIG. 7 shows the amplitude curve of the echos E1 through E7 on the basis of the T2 drop. It can be seen that the late echos of the pulse train exhibit a clearly lower amplitude; but this can be in turn compensated with the above-described averaging after the acquisition of two complete raw data sets.

It should be noted here that the method disclosed herein can be combined with the half-Fourier method, wherein not all, but only somewhat more than half, of all rows of a raw data matrix are measured. Since the raw data matrix is conjugate-symmetrical in the ideal case, the measurement of half a raw data set suffices for producing a complete image.

Moreover, three-dimensional data sets can be produced with the disclosed method in a known manner, by implementing a further phase-encoding in a direction perpendicular to the phase-encoding gradient and to the readout gradient. Since such a method is adequately known, it need not be discussed in greater detail herein.

Figure 8:
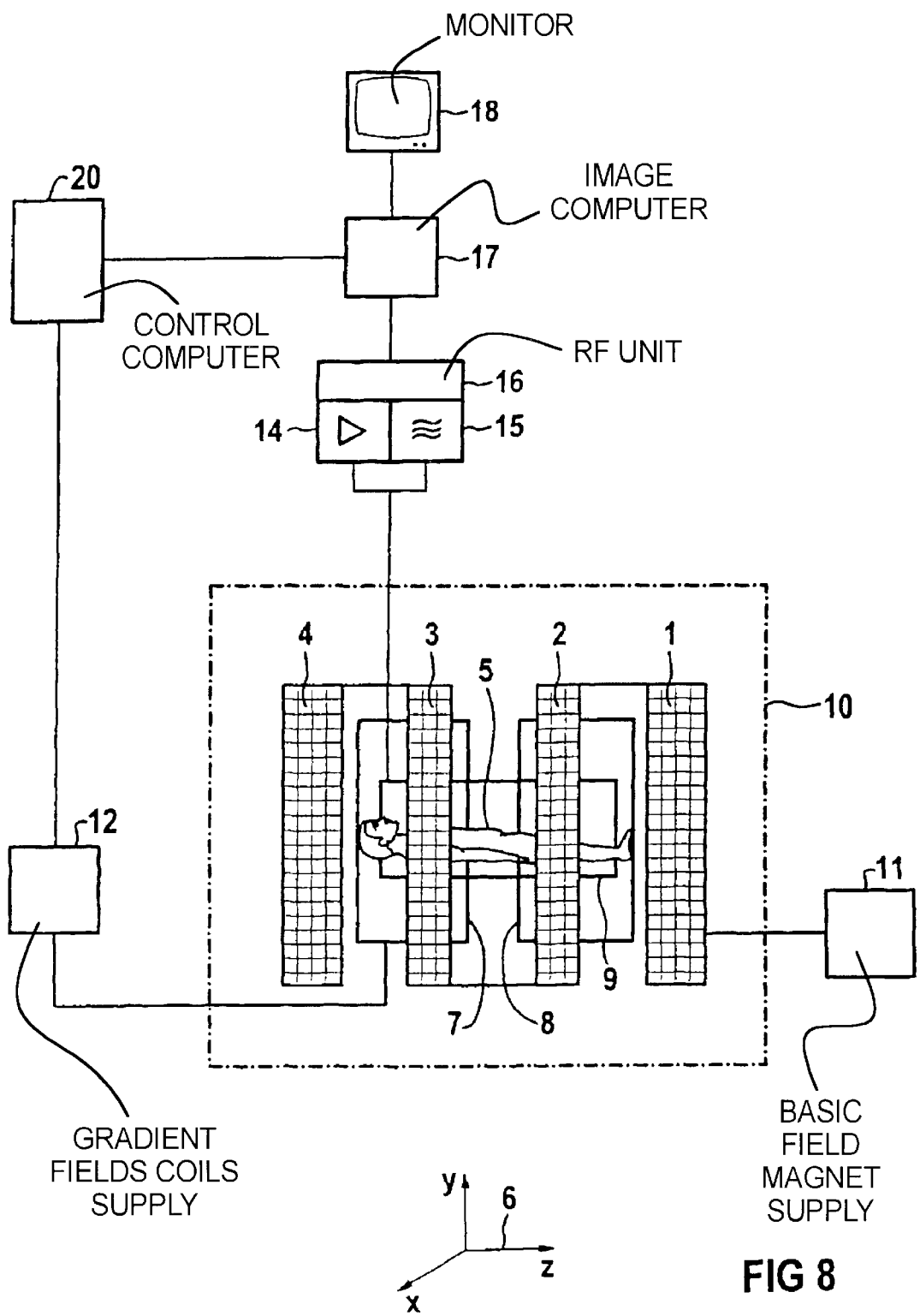
FIG. 8 is a block diagram of an exemplary embodiment for an inventive apparatus for implementation of the inventive method.

FIG. 8 shows the structure of an inventive nuclear magnetic resonance tomography apparatus in a highly schematic form. This is composed of a magnet system 1 through 4 generating a uniform basic field that is supplied by a basic field magnet supply 11. Gradient coil systems 7, 8 that are driven by a gradient amplifier in a gradient field coil supply 12 are provided in the magnet system. The gradient coil systems are implemented for generating magnetic field gradients in three spatial directions x, y, z of a coordinate system 6. The basic field magnet system 1–4 and the gradient coil systems form a date measurement unit 10. The examination subject 5 is surrounded in the data measurement unit 10 by a radio-frequency antenna 9 that is connected to a radio-frequency transmission unit 14 as well as to a radio-frequency reception unit 15. The radio-frequency transmission unit 14 and the radio-frequency reception unit 15 are a component of a radio-frequency system 16 in which, among other things, the received signals are sampled and demodulated phase-sensitively. An image that is shown on a monitor 18 is obtained from the demodulated signals with an image computer 17. The entire unit is driven such by a control computer 20 so that, for example, a pulse sequence according to FIG. 6 is produced and the above-described classification of the raw data into a raw data memory ensues.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring raw data for calculating an image of an examination subject using magnetic resonance signals, comprising the steps of:
    (a) irradiating an examination subject with a plurality of successive RF excitation pulses respectively separated by a repetition time;
    (b) within each repetition time, irradiating said examination subject with at least one RF refocusing pulse after the RF excitation pulse;
    (c) after each RF refocusing pulse, acquiring at least one magnetic resonance echo signal;
    (d) phase-encoding each echo signal in at least one direction by a predetermined phase-encoding gradient;
    (e) sampling, digitizing and phase-sensitively demodulating each echo signal, to obtain processed echo signals, and entering the processed echo signals into respective rows of a raw data matrix in an order corresponding to the phase-encoding of the processed echo signals; and
    (f) conducting the phase-encoding of the echo signals with a time sequence so that all echo signals occurring within a repetition time after the RF excitation pulse in that repetition time are allocated to segments of said raw data matrix respectively formed by sets of successive rows of said raw data matrix.

2. A method as claimed in claim 1 wherein said raw data matrix contains central rows, and wherein said plurality of RF excitation pulses include a first RF excitation pulse, and wherein step (f) comprises allocating to said central rows the processed echo signals obtained from the magnetic resonance echo signals acquired in the repetition time immediately following said first RF excitation pulse, and allocating the processed echo signals associated with later RF pulses to rows in said raw data matrix with increasing distance from said center rows.

3. A method as claimed in claim 2 wherein step (b) comprises irradiating said examination subject with a plurality of RF refocusing pulses after each said RF excitation pulse, and increasing said plurality of RF refocusing pulses with increasing time after said first RF excitation pulse.

4. A method as claimed in claim 1 wherein the echo signals acquired in successive repetition times has respectively different signal amplitudes due to a T2 drop, and wherein step (e) comprises allocating respective echo signals obtained in different repetition times to each row of at least one of said segments, and averaging said two echo signals.

5. A method as claimed in claim 4 wherein the echo signals for all rows of at least one of said segments are acquired after two successive RF excitation pulses and are entered into said segment with opposite sequence of row occupation, and wherein said echo signals in said at least one segment are averaged for each row.

6. A method as claimed in claim 1 wherein filling of said raw data matrix represents occupation of k-space, and wherein only slightly more than half of the k-space is occupied with said echo signals.

7. A method as claimed in claim 1 comprising the additional step of additionally encoding said echo signals with a phase-encoding gradient in a slice selection direction, and wherein said raw data matrix is a three-dimensional raw data matrix wherein said processed echo signals are allocated also dependent on said slice selection phase-encoding gradient.

8. A magnetic resonance tomography apparatus comprising:

- a basic field magnet, adapted to receive a subject therein, for producing a basic magnetic field in which the subject is situated;
- an RF arrangement for irradiating the examination subject with a plurality of successive RF excitation pulses respectively separated by a repetition time and, within each repetition time after each said RF excitation pulse, irradiating said examination subject with at least one RF refocusing pulse;
- at least one gradient coil which generates a phase-encoding gradient field;
- said RF unit, after each said refocusing pulse, acquiring at least one magnetic resonance echo signal from said subject, each echo signal being phase-encoded by said gradient field;
- means for sampling, digitizing and phase-sensitively demodulating each said magnetic resonance echo signal to obtain processed echo signals;
- a memory comprising a raw data matrix for storing said processed echo signals in an order in said memory corresponding to the phase-encoding of the processed echo signals; and
- means for operating said gradient coil to phase-encode said echo signals so that processed echo signals, representing echos occurring after each RF excitation pulse, are entered into said raw data matrix segments of said raw data matrix respectively formed by sets of successive rows of said raw data matrix.

* * * * *